United States Patent [19]
Schwalke

[11] Patent Number: 5,965,926
[45] Date of Patent: Oct. 12, 1999

[54] CIRCUIT STRUCTURE HAVING AT LEAST ONE MOS TRANSISTOR AND METHOD FOR ITS PRODUCTION

[75] Inventor: Udo Schwalke, Heldenstein, Germany

[73] Assignee: Siemens Aktiengesellschaft, Munich, Germany

[21] Appl. No.: 08/829,939

[22] Filed: Apr. 1, 1997

[30] Foreign Application Priority Data

Apr. 1, 1996 [DE] Germany ................ 196 12 950

[51] Int. Cl.⁶ ................ H01L 29/76; H01L 29/94
[52] U.S. Cl. ................ 257/407; 257/328; 257/336; 257/344; 257/408
[58] Field of Search ................ 257/328, 336, 257/344, 407, 408

[56] References Cited

U.S. PATENT DOCUMENTS

| | | |
|---|---|---|
| 5,418,392 | 5/1995 | Tanabe . |
| 5,693,975 | 12/1997 | Lien ........................ 257/374 |
| 5,786,620 | 7/1998 | Richards, Jr. et al. ........ 257/408 |
| 5,844,272 | 12/1998 | Söderbärg et al. ........ 257/328 |

FOREIGN PATENT DOCUMENTS

| | | |
|---|---|---|
| 0 111 347 | 6/1984 | European Pat. Off. . |
| 0 798 785 A1 | 10/1997 | European Pat. Off. . |
| A-0 657 929 A2 | 11/1994 | Germany . |
| 4-196437 | 7/1992 | Japan . |

*Primary Examiner*—Valencia Martin-Wallace
*Attorney, Agent, or Firm*—Hill & Simpson

[57] ABSTRACT

A circuit structure having at least one MOS transistor whose source/drain regions are doped by a first conductivity type and whose gate electrode is doped by a conductivity type which is opposite to the first. The gate electrode has a lower dopant concentration at at least one of its edges than in its center. In the ON state, the gate electrode is driven to accumulation, with the result being that no gate depletion occurs. Such a circuit structure is also suitable for CMOS circuits containing PMOS transistors having an n-doped gate.

4 Claims, 4 Drawing Sheets

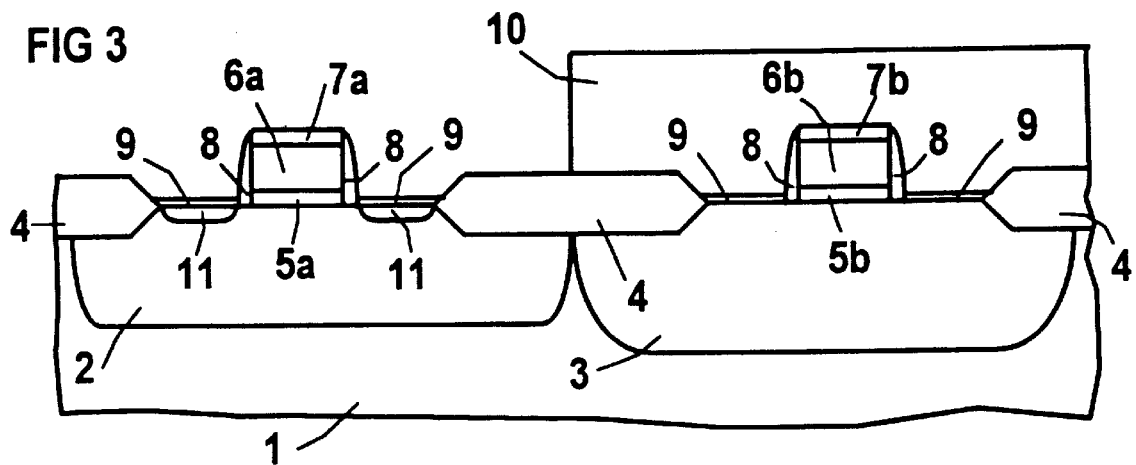
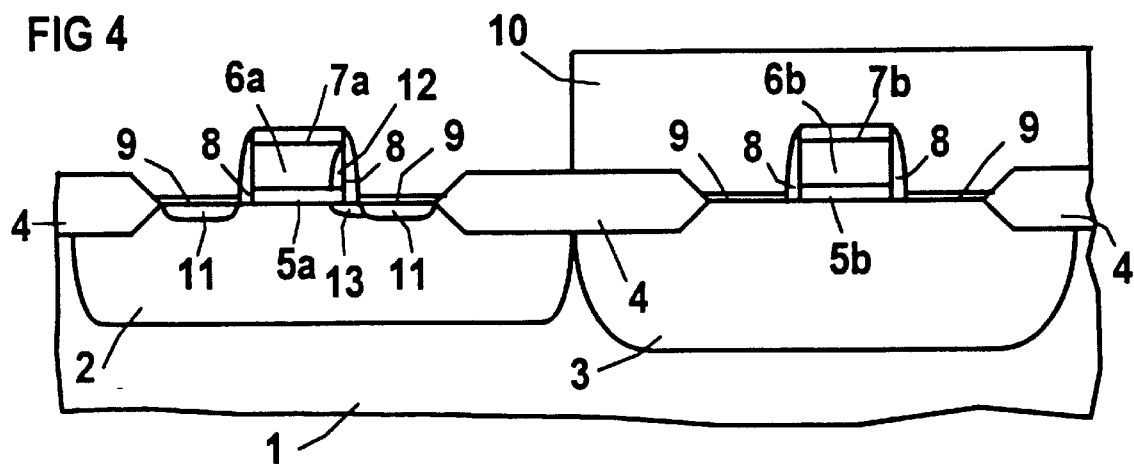

CIRCUIT STRUCTURE HAVING AT LEAST ONE MOS TRANSISTOR AND METHOD FOR ITS PRODUCTION

BACKGROUND OF THE INVENTION

1. Field of the Invention

The present invention is directed to a circuit structure having at least one MOS transistor in which the MOS transistor has both an improved gate oxide reliability and improved leakage current behavior in conjunction with a low resistance of the gate electrode.

2. Description of the Prior Art

MOS transistors having a short channel length are required for various technical applications, particularly in connection with low voltage/low power applications. Many such MOS transistors have gate electrodes made of heavily doped polysilicon. However, n+-doped silicon and p+-doped silicon differ by 1.1 eV in terms of their work function. As such, in a MOS transistor having a gate electrode made of heavily doped polysilicon, this work function difference results in an increase in the electric field strength between the gate electrode and the drain-side pn junction when the conductivity type of the gate electrode differs from the conductivity type of the source/drain regions. This applies both to MOS transistors having an n+-doped gate electrode and p+-doped source/drain regions and to MOS transistors having a p+-doped gate electrode and n+-doped source/drain regions. This increase in the electric field strength leads to a reduction in the reliability of the gate oxide.

The increase in electric field strength becomes particularly problematic in the case of MOS transistors having channel lengths of less than 0.25 um, such as are used for low voltage/low power applications with supply voltages of less than 3 volts. In such cases, the thickness of the gate oxide is less than 5 nm, since the work function difference is constant and does not scale with the supply voltage.

The leakage current behavior is also impaired as a consequence of this increase in the electric field strength. Indeed, the gate-induced drain leakage current (Gate Induced Drain Leakage GIDL) rises because the band-to-band tunneling probability increases owing to the increased electric field strength.

The increased electric field strength between the gate electrode and the drain-side pn junction can be diminished or removed by using a different material for the gate electrode, this material having a lower or even no work function difference with respect to the material of the source/drain region. It has been proposed to form the gate electrode of a MOS transistor from doped polysilicon which is doped by the same conductivity type as the transistor's source/drain regions (see C. Parrillo, IEDM '85, p. 398). It has also been proposed to form the gate electrode from tin (see, for example, J. M. Hwang et al., IEDM '92, p. 345) or tungsten (see, for example, N. Kasai et al., IEDM '88, p. 242). However, there is a risk of gate oxide damage associated with the use of metal-containing materials in forming gate electrodes. In CMOS circuits, for example, which include both n-channel transistors and p-channel transistors, the use of doped polysilicon of the same conductivity type as the source/drain regions for the gate electrode leads to (1) more complicated process control, (2) the boron penetration effect., (3) lateral dopant diffusion in continuous n+-type/p+-type gate lines, and (4) sensitivity to the gate depletion effect.

Furthermore, it has been proposed to modify the work function of n+-doped or p+-doped polysilicon by means of additional doping with germanium (see, for example, T. J. King et al., IEDM '90, p. 253). This measure, too, leads to complicated process control since, on the one hand, special equipment is required and, on the other hand, it is necessary to adapt the process steps to the altered material properties; for example, during etching.

Most recently, in EP-A-0 657 929, it has been proposed, for the purpose of improving (1) the short-channel effects, (2) the leakage current behavior and (3) the reliability of the gate oxide, that the n+-doped gate electrode be counter-doped by means of additional boron implantation in the case of p-channel MOS transistors having an n+-doped gate electrode. Such counter-doping alters the work function of the gate electrode without altering its conductivity type. The dopant concentration in the gate electrode is changed as a result of this measure. Accordingly, the resistance of the gate electrode rises, which then leads to a voltage drop across the gate electrode.

BRIEF SUMMARY OF THE INVENTION

The present invention is based on the problem of specifying a circuit structure having at least one MOS transistor in which the MOS transistor has both an improved gate oxide reliability and improved leakage current behavior in conjunction with a low resistance of the gate electrode. A method for producing such circuit structure is also specified.

To this end, in an embodiment of the present invention, the MOS transistor in the circuit structure has a gate electrode which is made of doped silicon which is doped by the opposite conductivity type to the source/drain regions of the MOS transistor. The gate electrode has a dopant profile such that the dopant concentration in the gate electrode is lower at at least one edge of the gate electrode than in the center of the gate electrode. The dopant concentration at the edge of the gate electrode preferably lies in the range between $10^{17}$ and $10^{19}$ cm$^{-3}$.

If the MOS transistor in turned ON, the edge of the gate electrode is driven to accumulation on account of the potential ratio. This preserves the essential properties of the transistor. If, on the other hand, the MOS transistor is in the OFF state, then a space charge zone is formed at the edge of the gate electrode owing to the lower dopant concentration. This space charge zone is formed above the source/drain region and reduces the electric field strength at that point. An a result, the problems associated with the increased electric field strength are avoided. The MOS transistor is preferably connected up during operation such that that edge of the gate electrode which has a lower dopant concentration adjoins the source/drain region which is connected up as drain.

Since the dopant concentration is higher in the center of the gate electrode than at the edge, the resistance of the gate electrode is accordingly determined by the dopant concentration in the center of the gate electrode. The increased dopant concentration in the center of the gate electrode causes it to have a lower resistance.

It is within the contemplation of the present invention to provide a lower dopant concentration at more than one edge of the gate electrode. In particular, the present invention contemplates a gate electrode having a rectangular cross-section, whereby a lower dopant concentration is realized at the four side areas of the rectangle.

At least one additional MOS transistor, which is complementary to the first-mentioned MOS transistor, is preferably provided in the circuit structure of the present invention. The gate electrode of the complementary MOS transistor is doped by the same conductivity type as the gate electrode of the first-mentioned MOS transistor.

During the production of the circuit structure according to the present invention, the gate electrode of the MOS transistor is preferably produced by (a) forming a doped silicon layer, (b) structuring the doped silicon layer, and (3) subsequently counter-doping the gate electrode at at least one edge. The gate electrode is counter-doped by inclined implantation with doping ions of the opposite conductivity type.

During the simultaneous production of both the MOS transistor and the mutually complementary MOS transistor, the gate electrodes of the two MOS transistors are formed by structuring the doped silicon layer. The dopant concentration at the edge of the gate electrode of the first-mentioned MOS transistor is reduced by means of counter-doping. The dopant concentration of the gate electrode of the complementary MOS transistor is increased by means of additional doping over the entire gate electrode.

The circuit structure according to the present invention is suitable both for low voltage/low power applications and for high-voltage transistors. In addition, the circuit structure according to the present invention is particularly suitable for smart power technologies or for flash EPROMs.

Additional features and advantages of the present invention are described in, and will be apparent from, the detailed description of the invention and the several views of the drawing.

BRIEF DESCRIPTION OF THE SEVERAL VIEWS OF THE DRAWING

FIG. 3 shows the substrate of FIG. 2 after the formation of p+-doped source/drain regions.

FIG. 4 shows the substrate of FIG. 3 after inclined implantation for reducing the dopant concentration at the edge of the gate electrode and for forming a terminal region.

DETAILED DESCRIPTION OF THE INVENTION

Figure 1:
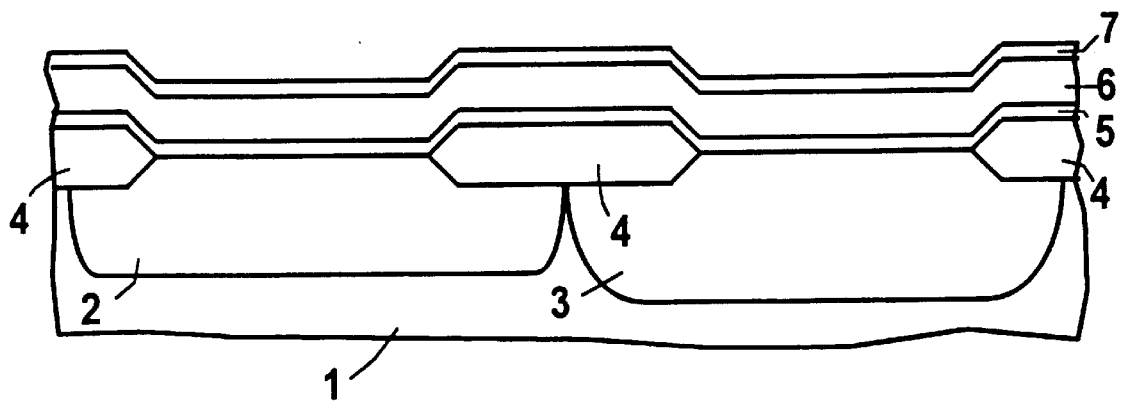
FIG. 1 shows a substrate with differently doped wells, field oxide regions, a dielectric layer, a doped silicon layer and a covering layer.

Referring to FIG. 1, an n+-doped well 2 and a p+-doped well 3 are initially formed in a known manner in a substrate 1. Substrate 1 is made, for example, of n+-doped or p+doped monocrystalline silicon having a base doping of $10^{15}$ cm$^{-3}$. In a LOCOS process, for example, field oxide regions 4 are produced which define an active region for a PMOS transistor in the n+-doped well 2, and an active region for an NMOS transistor in the p+-doped well 3. A dopant concentration of, for example, $10^{17}$ cm$^{-3}$ of boron is set in the p+-doped well 3; a dopant concentration of, for example, $10^{17}$ cm$^{-3}$ of phosphorus is set in the n+-doped well 2.

A dielectric layer 5 made, for example, of SiO$_2$ by means of thermal oxidation is grown over the whole area to a layer thickness of 3 to 10 nm. A doped silicon layer 6 made, for example, of in situ-doped n+-doped polysilicon or in situ-doped n+-doped amorphous silicon-is produced on the dielectric layer 5. Arsenic or phosphorus is used as the dopant. The dopant concentration in less than $1\times10^{20}$ atoms/cm$^{-3}$ and is preferably $5\times10^{19}$ atoms/cm$^{-3}$. At this dopant concentration, the silicon is doped in such a way that it is still just degenerate. The doped silicon layer 6 may alternatively be formed by the deposition of undoped amorphous or polycrystalline silicon and the subsequent doping, for example, by means of deposition or implantation. In situ-doped silicon is preferred, however, for the doped silicon layer 6 owing to the more uniform dopant distribution and activation.

A covering layer 7 made, for example, of Si$_3$ N$_4$ or CVD-deposited SiO$_2$ is applied to the doped silicon layer 6 over the whole area. The doped silicon layer 6 is formed with a layer thickness of, for example, 100 to 500 nm. The covering layer is formed with a layer thickness of, for example, 100–200 nm CVD-deposited SiO2. Using photolithographic process steps, a mask (not illustrated) is subsequently formed which assists in the structuring of the covering layer 7, the doped silicon layer 6 and the dielectric layer 5 in an anisotropic etching step, using HBr/cl$_2$ for example.

Figure 2:
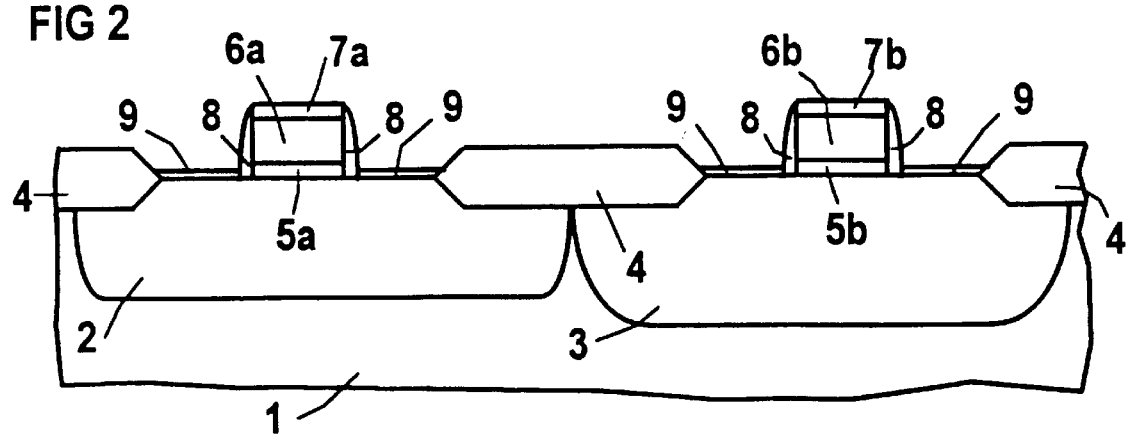
FIG. 2 shows the substrate of FIG. 1 after the formation of gate electrodes, flank coverings on the gate electrodes and screen oxide layers on the surface of the wells.

During the above-described process, a gate dielectric 5a, a gate electrode 6a and a covering 7a are produced for the PMOS transistor as shown in FIG. 2. A gate dielectric 5b, a gate electrode 6b and a covering 7b are produced for the NMOS transistor. The flanks of covering 7a and 7b, gate electrode 6a and 6b and gate dielectric 5a and 5b are subsequently provided with SiO$_2$ spacers 8. For this purpose, an SiO$_2$ layer is deposited with a conformal edge which covers the whole area and which is structured by being anisotropically etched back. The exposed surfaces of the p+-doped well 3 and of the n+-doped well 2 are thermally reoxidized. In the process, a screen oxide 9 is formed with a layer thickness of, for example, 10 nm.

Turning now to FIG. 3, first photoresist mask 10 is formed which covers the active region for the NMOS transistor. Implantation with boron or BF$_2$ is subsequently carried out, during which time p+-doped regions 11 for the PMOS transistor are formed. The implantation is carried out, for example, with $5\times10^{15}$ B/cm$^2$ at an energy of 10 keV. The covering 7a protects the gate electrode 6a from the implanting ions. This necessitates a layer thickness of at least 100 nm SiO$_2$ or 80 nm of Si$_3$N$_4$ for the covering 7a. The implantation is carried out essentially at right angles to the surface of the substrate 1.

Further implantation with boron is subsequently carried out, as shown in FIG. 4, at which time the implantation direction is inclined. The implantation in preferably carried out an angle 10–30° to the normal of the substrate surface. In the process, a lesser-doped region 12 is formed at the edge of the gate electrode 6a. The dopant concentration in the lesser-doped region 12 is established as a result of counter-doping of the boron ions with the n+-doping ions of the doped silicon layer 6. The net dopant concentration in the lesser doped region 12 is preferably set at $10^{18}$ cm$^{-3}$. A shallow terminal region 13, which adjoins one of the p+doped regions 11, is simultaneously produced in the course of the inclined implantation. The inclined implantation can be carried out four times on the substrate 1, which is rotated at 90° each time, in order to obtain a symmetrical arrangement (not illustrated).

Figure 5:
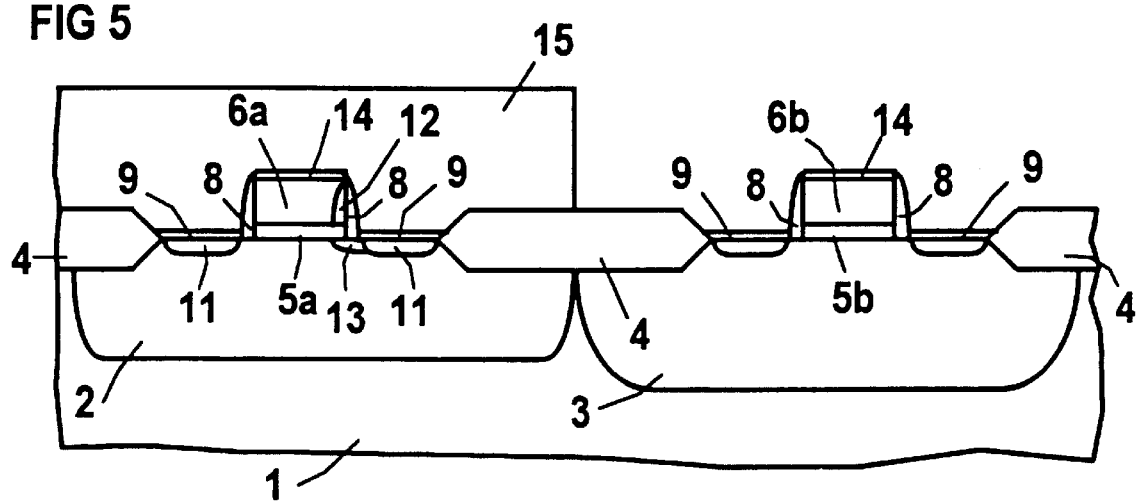
FIG. 5 shows the substrate of FIG. 4 after the formation of a further mask and after the formation of n+-doped source/drain regions.

Referring to FIG. 5, after the removal of the first photoresist mask 10, the covering 7a, 7b of Si$_3$N$_4$ is removed using, for example, $H_3PO_4$. The exposed surfaces of the gate electrodes 6a and 6b are provided with a screen oxide 14. The screen oxide 14 is formed, for example, by means of thermal oxidation to a layer thickness of 10 nm. A second photoresist mask 15, which covers the active region for the PMOS transistor, is subsequently formed. The active region for the NMOS transistor is, in contrast, exposed. Arsenic or phosphorus implantation is carried out, during which time n+-doped regions 16 are produced. The dopant concentration in the gate electrode 6b is simultaneously increased. The implantation is carried out, for example, with $5 \times 10^{15}$ As/cm$^2$ at 80 keV.

Figure 6:
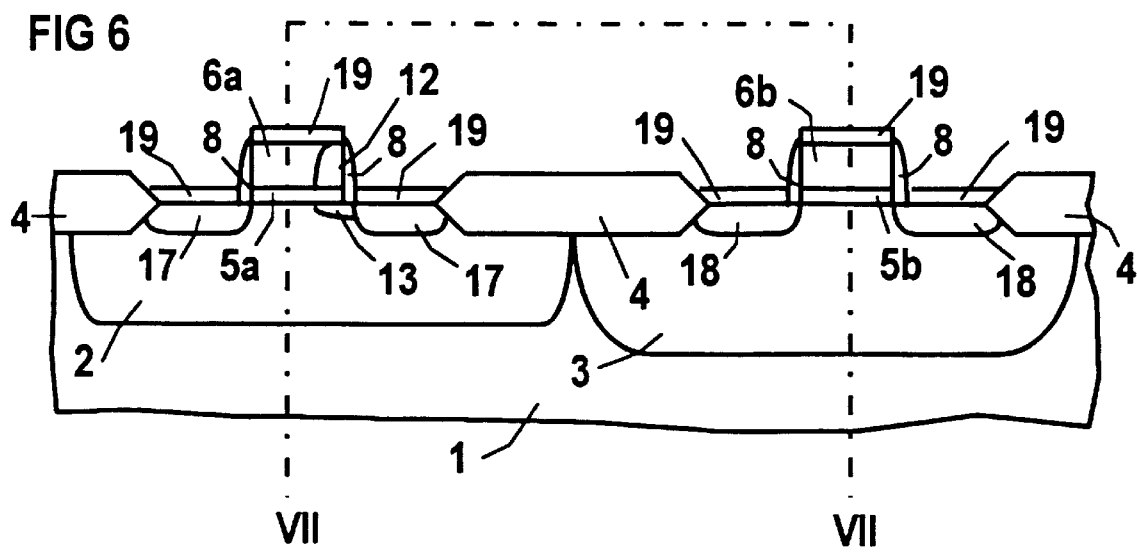
FIG. 6 shows the substrate of FIG. 5 after a heat-treatment step for activating the dopants and after the siliconisation of the surface of the source/drain regions and of the gate electrodes.

After removal of the second photorestint mask 15, the substrate 1 is heat-treated. The dopant is electrically activated in the process. At the same time, and as shown in FIG. 6, p+-doped source/drain regions 17 are formed from the p+-doped regions 11 and n+-doped source/drain regions 18 are formed from the n+-doped regions 16. The extent of the lesser-doped region 12 and of the terminal region 13 is likewise increased.

The screen oxide 9, 14 is subsequently removed, for example, by means of a brief HF dip. The silicon surfaces of the p+-doped source/drain regions 17, of the n+-doped source/drain regions 18 and of the gate electrodes 6a, 6b, and which are exposed in the process, are subsequently provided with a metallic conductor 19 in order to improve the contact resistance. The metallic conductor 19 is formed, for example, by means of a self-aligned silicide reaction with $TiSi_2$ or by means of the selective deposition of metal, for example, CVD-tungsten. In addition to increasing the conductivity of the gate electrodes 6a, 6b, the metallic conductor 19 bridges adjoining n+-doped regions and n+-doped regions of the gate electrodes 6a, 6b.

Figure 7:
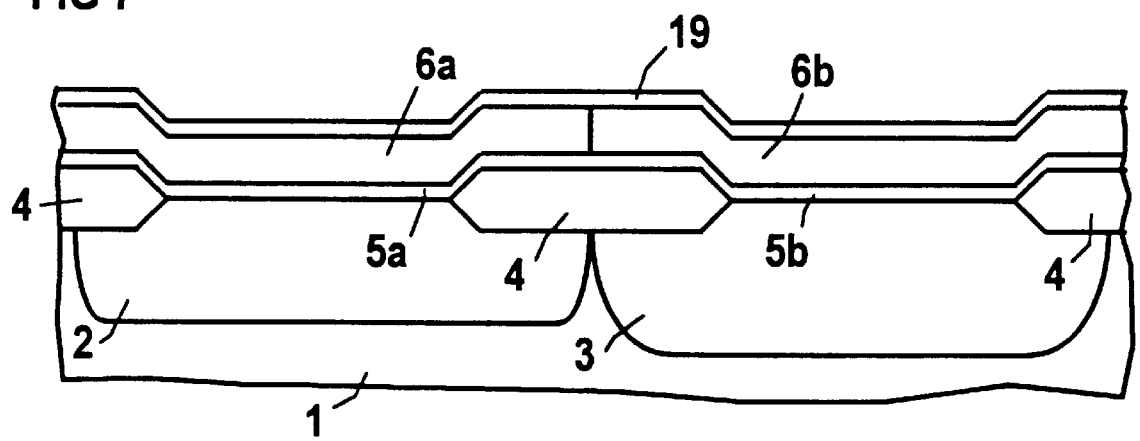
FIG. 7 shows the sectional view designated by line VII—VII in FIG. 6.

FIG. 7 illustrates the section through the structure which is designated by lines VII—VII in FIG. 6. Outside the plane of the drawing which is illustrated in FIG. 6, the gate electrodes 6a, 6b run above the field oxide regions 4 whereat they are connected to one another. The metallic conductor 19 ensures homogeneous conductivity in this connection region.

In order to complete the circuit structure, a passivation layer is applied, for example, by means of BPSG deposition and subsequent planarisation, in which passivation layer contact holes are etched and metallized. These process steps are not illustrated in detail.

The method can also be employed for CMOS circuits having a p+-doped gate electrode. In this case, the gate electrode of the n-channel MOS transistor is provided with a lesser-doped region at the edge. In contrast, the gate electrode of the p-channel MOS transistor is doped more heavily by means of additional implantation.

It should be understood that various changes and modifications to the presently preferred embodiment described herein will be apparent to those skilled in the art. Such changes and modifications may be made without departing from the spirit and scope of the present invention and without diminishing its attendant advantages. It is, therefore, intended that such changes and modifications be covered by the appended claims.

I claim as my invention:

1. A circuit structure having an MOS transistor, comprising:

a semiconductor substrate;

two source/drain regions in said semiconductor substrate which are doped with a first conductivity type;

a channel region arranged between said source/drain regions;

a gate dielectric arranged on a surface of said channel region; and a gate electrode arranged on said gate dielectric over said surface of said channel region, said gate electrode being comprised of silicon which is doped with a second conductivity type opposite to said first conductivity type, said gate electrode having a first dopant concentration at at least one edge of said gate electrode which is lower than a second dopant concentration at a center area of said gate electrode.

2. The circuit structure according to claim 1, wherein said first dopant concentration is in a range between $10^{17}$ and $10^{19}$ cm$^{-3}$.

3. The circuit structure according to claim 1, wherein said MOS transistor is a first MOS transistor and said circuit structure further comprises:

a second MOS transistor which is complementary to said first MOS transistor, said second MOS transistor having two complementary source/drain regions which are doped with said second conductivity type and having a complementary gate electrode comprised of silicon which is doped with said second conductivity type.

4. The circuit structure according to claim 2, wherein said MOS transistor is a first MOS transistor and said circuit structure further comprises:

a second MOS transistor which is complementary to said first MOS transistor, said second MOS transistor having two complementary source/drain regions, which are doped with said second conductivity type and having a complementary gate electrode comprised of silicon which is doped with said second conductivity type.

\* \* \* \* \*